United States Patent
Nakamura et al.

(10) Patent No.: US 8,749,073 B2
(45) Date of Patent: Jun. 10, 2014

(54) WIRING BOARD, METHOD OF MANUFACTURING THE SAME, AND SEMICONDUCTOR DEVICE

(75) Inventors: Junichi Nakamura, Nagano (JP); Kentaro Kaneko, Nagano (JP); Shunichiro Matsumoto, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 68 days.

(21) Appl. No.: 13/154,565

(22) Filed: Jun. 7, 2011

(65) Prior Publication Data

US 2011/0304016 A1 Dec. 15, 2011

(30) Foreign Application Priority Data

Jun. 9, 2010 (JP) ................................. 2010-132303

(51) Int. Cl.
*H01L 23/495* (2006.01)
*H01L 23/48* (2006.01)
*H01L 23/52* (2006.01)
*H01L 29/40* (2006.01)

(52) U.S. Cl.
USPC ................... 257/782; 257/667; 257/E23.062; 257/E21.511

(58) Field of Classification Search
USPC .......... 257/667, 758, 781, E23.062, E21.511
See application file for complete search history.

(56) References Cited

U.S. PATENT DOCUMENTS

| | | | |
|---|---|---|---|
| 6,521,997 B1 * | 2/2003 | Huang et al. | 257/737 |
| 6,546,620 B1 * | 4/2003 | Juskey et al. | 29/840 |
| 7,145,234 B2 * | 12/2006 | Chang et al. | 257/734 |
| 7,268,437 B2 * | 9/2007 | Liu | 257/780 |
| 2003/0151135 A1 * | 8/2003 | Sakamoto et al. | 257/723 |
| 2005/0067177 A1 * | 3/2005 | Saito et al. | 174/52.2 |
| 2006/0131065 A1 * | 6/2006 | Ohwaki | 174/252 |
| 2007/0124924 A1 * | 6/2007 | Nakamura | 29/830 |
| 2010/0084163 A1 * | 4/2010 | Kodani et al. | 174/250 |

FOREIGN PATENT DOCUMENTS

| | | |
|---|---|---|
| JP | 2000-260909 | 9/2000 |
| JP | 2004-152943 | 5/2004 |
| JP | 2005-236035 A1 | 9/2005 |
| JP | 2007-335740 A1 | 12/2007 |

OTHER PUBLICATIONS

Office Action from Japanese Patent Office mailed Jan. 28, 2014 in counterpart application No. 2010-132303 with English translation.

* cited by examiner

*Primary Examiner* — Cheung Lee
*Assistant Examiner* — Jeremy Joy
(74) *Attorney, Agent, or Firm* — Kratz, Quintos & Hanson, LLP

(57) ABSTRACT

A wiring board includes a structure in which a plurality of wiring layers are stacked with insulating layers interposed therebetween, a plurality of pads for mounting an electronic component, the pads being formed on an outermost insulating layer on one surface side of the structure and exposed to the surface of the outermost insulating layer, and a recessed portion formed at a place corresponding to a mounting area for the electronic component. The recessed portion is formed in the outermost insulating layer at an area between the pads to which electrode terminals of the electronic component to be mounted are to be connected, respectively.

6 Claims, 16 Drawing Sheets

WIRING BOARD, METHOD OF MANUFACTURING THE SAME, AND SEMICONDUCTOR DEVICE

CROSS-REFERENCE TO RELATED APPLICATION

This application is based upon and claims the benefit of priority of the prior Japanese Patent Application No. 2010-132303, filed on Jun. 9, 2010, the entire contents of which are incorporated herein by reference.

FIELD

The embodiments discussed herein are related to a wiring board for mounting a passive device such as a chip capacitor together with an active device such as a semiconductor element. They are also related to a method of manufacturing the wiring board, and to a semiconductor device.

Such a wiring board is also referred to as a "semiconductor package" in the following description for the sake of convenience because it functions as a package for mounting a semiconductor element and the like thereon.

BACKGROUND

Small electronic components such as a chip capacitor are mounted on a wiring board (semiconductor package), together with a semiconductor element (chip). Such packages have experienced generalization of high density mounting in recent years, and in particular, a semiconductor chip such as an MPU requiring a switching operation with higher speed is mounted on a package. On such a package, a large number of chip capacitors are mounted for suppressing signal transmission delays or the like caused by an increase in inductance generated in an interconnection or by capacity coupling between interconnections. Such chip capacitors also function as decoupling capacitors for stabilizing the power supply voltage by reducing crosstalk noise, switching noise and the like.

Moreover, a wiring board having a semiconductor element and chip capacitors mounted thereon has a structure in which the entire capacitors and the semiconductor element are encapsulated with a molding resin for insulating exposed conductor portions thereof from the external.

An example of such a structure is described in Patent document 1 (Japanese Laid-open Patent Publication No. 2005-236035). Another example related to the structure is described in Patent document 2 (Japanese Laid-open Patent Publication No. 2007-335740).

Chip capacitors are very small electronic components as compared with semiconductor elements. Accordingly, when such chip capacitors are mounted on a board, a gap between each of the chip capacitors and the surface of the package (board) becomes very small. As a result, when the capacitors are encapsulated with a molding resin, a void (air bubble) is likely to be generated in the resin filled in a gap between each of the capacitors and the board, in the process in which the resin flows to the inner side of the gap from the periphery portion of the gap around the capacitor (portion from which the resin is injected).

Where such a void remains without being released, an inconvenience may occur in that the capacitor causes a short circuit via the void due to aged deterioration (such as moisture invasion) during use of the product (semiconductor device). Such a problem may also occur on a package where a similar passive device such as a chip-shaped resistance element is mounted.

SUMMARY

According to a first aspect of the invention, there is provided a wiring board including a structure in which a plurality of wiring layers are stacked with insulating layers interposed therebetween; a plurality of pads for mounting an electronic component, the pads being formed on an outermost insulating layer on one surface side of the structure and exposed to a surface of the outermost insulating layer; and a recessed portion formed in the outermost insulating layer at a place corresponding to a mounting area for the electronic component.

According to a second aspect of the invention, there is provided a wiring board including a structure in which a plurality of wiring layers are stacked with insulating layers interposed therebetween; and a plurality of pads for mounting an electronic component, the pads being formed at an outermost insulating layer on one surface side of the structure and exposed to protrude from a surface of the outermost insulating layer.

According to a third aspect of the invention, there is provided a method of manufacturing a wiring board, including forming a first resist layer on a support base member, the first resist layer being patterned to have an opening portion at a place corresponding to a mounting area for an electronic component; forming a sacrificial conductor layer on the support base member exposed through the opening portion of the first resist layer; forming a second resist layer on the support base member and the sacrificial conductor layer after removing the first resist layer, the second resist layer being patterned to have opening portions at both sides of the sacrificial conductor layer in the mounting area for the electronic component; forming pads on the support base member exposed through the opening portions of the second resist layer; forming an insulating layer on the support base member and the sacrificial conductor layer after removing the second resist layer, the insulating layer covering the pads; forming a wiring layer on the insulating layer, the wiring layer including vias to be connected to the pads, respectively; and alternately stacking insulating layers and wiring layers, and then removing the support base member.

According to a fourth aspect of the invention, there is provided a method of manufacturing a wiring board, including forming a resist layer on a support base member, the resist layer being patterned to have opening portions at places corresponding to a mounting area for an electronic component; forming recessed portions by removing portions of the support base member, the recessed portions being exposed through the opening portions of the resist layer, respectively; forming pads in the recessed portions of the support base member exposed through the opening portions of the resist layer, respectively; forming an insulating layer on the support base member after removing the resist layer, the insulating layer covering the pads; forming a wiring layer on the insulating layer, the wiring layer including vias to be connected to the pads, respectively; and alternately stacking insulating layers and wiring layers, and then removing the support base member.

According to a fifth aspect of the invention, there is provided a semiconductor device including a wiring board including: a structure in which a plurality of wiring layers are stacked with insulating layers interposed therebetween; a plurality of pads for mounting an electronic component, the pads being formed on an outermost insulating layer on one surface side of the structure and exposed to a surface of the outermost insulating layer; and a recessed portion formed in the outermost insulating layer at a place corresponding to a mounting area for the electronic component; a semiconductor element mounted at a center portion on the outermost insulating layer; an electronic component mounted on the pads; and an insulating layer for encapsulating the electronic component and the semiconductor element, wherein resin of the insulating layer is filled in the recessed portion.

According to a sixth aspect of the invention, there is provided a semiconductor device including a wiring board including: a structure in which a plurality of wiring layers are stacked with insulating layers interposed therebetween; and a plurality of pads for mounting an electronic component, the pads being formed at an outermost insulating layer on one surface side of the structure and exposed to protrude from a surface of the outermost insulating layer; and a semiconductor element mounted at a center portion on the outermost insulating layer; an electronic component mounted on the pads; and an insulating layer for encapsulating the electronic component and the semiconductor element, wherein resin of the insulating layer is filled between the electronic component and the surface of the wiring board.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

To begin with, preliminary matters for facilitating understanding of embodiments are described with reference to FIGS. 16A and 16B before the embodiments are described.

Figure 16A:
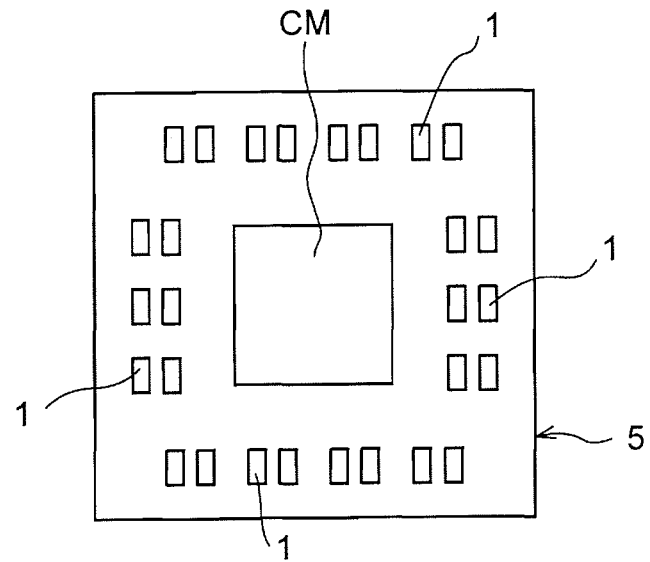
FIGS. 16A and 16B are views illustrating an example of the case where chip capacitors are mounted, as an example of the related art, and for explaining a problem with the related art.
Figure 16B:
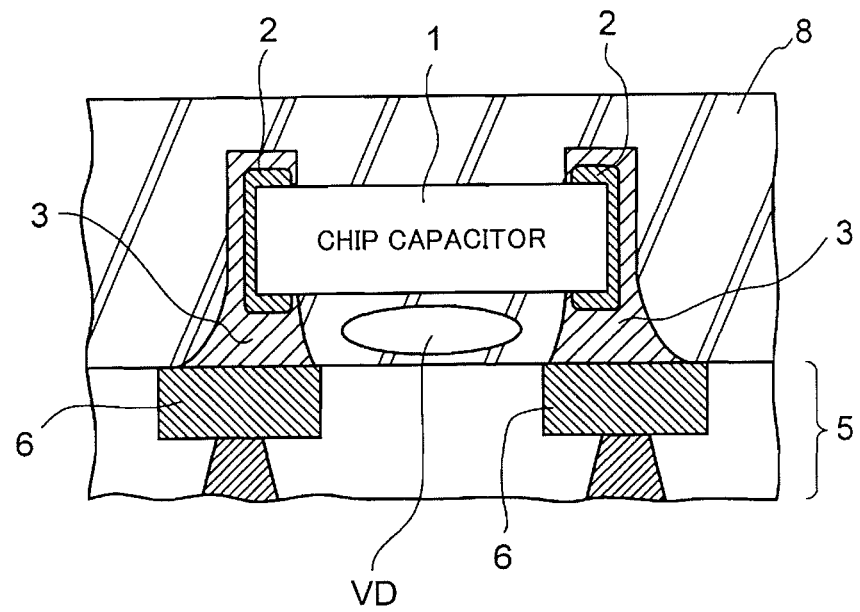

FIG. 16A schematically illustrates an example of the case where chip capacitors are mounted. In this example, a large number of chip capacitors 1 are arranged in a peripheral region to surround a center portion (semiconductor element mounting area CM) on a wiring board (package) 5. As illustrated in FIG. 16B, each of the chip capacitors 1 is entirely encapsulated with a molding resin 8 so as to insulate exposed conductor portions (portions of solder 3 which connect electrode terminals 2 of the chip capacitor 1 to respective pads 6 on the wiring board 5) from the outside thereof after the chip capacitors 1 are mounted on the wiring board 5. During the process of encapsulating the chip capacitors 1, the molding resin 8 is also filled in a gap between the surface of the package and each of the chip capacitors 1. Moreover, although not illustrated in FIGS. 16A and 16B, a semiconductor chip is mounted in the semiconductor element mounting area CM on the wiring board 5, and is also covered by the molding resin 8.

Thus, on the wiring board (semiconductor package) on which a semiconductor element (chip) is mounted, chip capacitors are also mounted for supporting a high-speed operation of the semiconductor element (chip). Moreover, the chip capacitors are entirely encapsulated with a molding resin so as to insulate the exposed conductor portions of the chip capacitors from the outside (see FIG. 16B).

However, the chip capacitors are very small electronic components (for example, 1.0 mm×0.5 mm×0.3 mm (thickness), 1.6 mm×0.8 mm×0.8 mm (thickness), or the like) as compared with semiconductor chips. Accordingly, when such chip capacitors are mounted on a board, a gap between the surface of the package (board) and each of the chip capacitors becomes very small (approximately 20 to 30 µm). As a result, when the capacitors are encapsulated with a molding resin, a void (air bubble) is likely to be generated in the resin filled in the gap between each capacitor and the board, in the process in which the resin flows to the inner side of the gap from the periphery portion of the gap around the capacitor (the portion from which the resin is injected). Namely, as exemplified in FIG. 16B, a void VD is formed in a resin portion between the solders 3 which connect the electrode terminals 2 of the chip capacitor 1 to the respective pads 6 on the board 5.

Where the void VD remains without being released, a conduction path causing a short circuit between one and the other of the solders 3 is formed via the void VD due to aged deterioration (such as moisture invasion) during use of the product. As a result, an inconvenience such as a short defect caused by the chip capacitor 1 may occur. Namely, a problem occurs in that the insulating properties are deteriorated.

Such a problem may occur not only on a package where a chip capacitor is mounted, but also on a package where a similar passive device such as a chip-shaped resistance element (small electronic component) is mounted.

Hereinafter, preferred embodiments of the invention are described.

Figure 1:
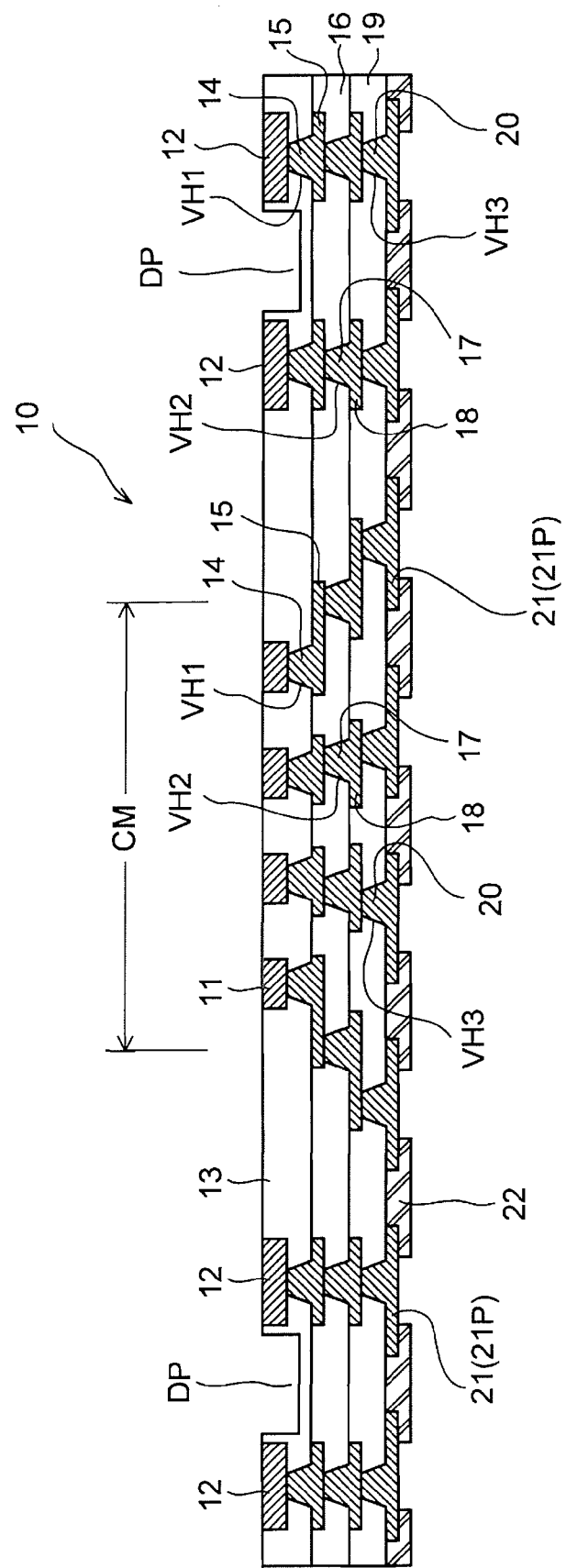
FIG. 1 is a cross-sectional view illustrating a configuration of a wiring board (semiconductor package) according to a first embodiment.

FIG. 1 illustrates in a cross-sectional view, a configuration of a wiring board (semiconductor package) according to a first embodiment.

The wiring board (semiconductor package) 10 according to the present embodiment has a structure in which a plurality of wiring layers 11, 12, 15, 18 and 21 are stacked with insulating layers 13, 16 and 19 interposed therebetween and are interconnected to each other via conductors (vias 14, 17 and 20) filled in via holes VH1, VH2 and VH3 formed in the corresponding insulating layers 13, 16 and 19. Namely, the wiring board (semiconductor package) 10 has the form of a "coreless substrate", which includes no support base member unlike a wiring board fabricated by a general build up process (i.e., wiring board fabricated by sequentially stacking build up layers on both surfaces of a core substrate serving as a support base member).

A solder resist layer 22 serving as a protection film is formed on one surface (lower side surface in the illustrated example) of the coreless substrate. The solder resist layer 22 covers the surface of an outermost wiring layer (wiring layer 21 in the illustrated example) except for portions of pads 21P each defined at a required position of the outermost wiring layer. On the other hand, two kinds of pads (portions of a wiring layer) 11 and 12 are exposed from a surface (upper side surface in the illustrated example) of the coreless substrate, which is opposite to the surface thereof where the solder resist layer 22 is formed. The pads 11 and 12 are formed so that the upper surfaces thereof are flush with the upper surface of the outermost insulating layer 13. Namely, the side surface and the via connection surface (i.e., the surface to which the via 14 is connected) of each of the pads 11 and 12 are covered by the insulating layer 13, while the surface thereof opposite to the via connection surface is exposed from the insulating layer 13.

Among the pads 11 and 12 exposed from the insulating layer 13, the pads 11 arranged in the center portion of the package 10 (a rectangular area in the plan view denoted by reference numeral CM) are used for connection with electrode terminals of a semiconductor element (chip) to be mounted on the package 10, while the pads 12 arranged around the chip mounting area CM are used for connection with electrode terminals of chip capacitors. Namely, the pads 11 are used for mounting a semiconductor element (chip) whereas the pads 12 are used for mounting a chip capacitor.

In addition, external connection terminals such as solder balls (not illustrated in FIG. 1) for mounting the package (wiring board) 10 on a motherboard or the like are to be bonded to pads 21P exposed from the solder resist layer 22 on the lower side. Alternatively, the pads 21P may be left exposed so that the pads 21P themselves are used as the external connection terminals. The upper side surface of the wiring board 10 defines a "chip mounting surface" whereas the lower side surface thereof defines an "external connection surface."

In addition, the solder resist layer 22 formed on the external connection surface of the wiring board 10 also serves as a reinforcement layer while serving as a protection film. Specifically, the package 10 is a coreless substrate with a low rigidity and with a small thickness, and thus is low in the board strength. However, the board can be reinforced by forming the solder resist layer 22 on the one surface of the board as illustrated.

Moreover, a recessed portion DP is formed on the insulating layer 13 on the chip mounting surface, at a portion where the pads 12 used for mounting a chip capacitor are formed. The structure of the recessed portion DP is described later. Moreover, specific materials, sizes, thicknesses and the like of constituent members of the wiring board (package) 10 are described later in relation with processes to be described later.

Figure 2:
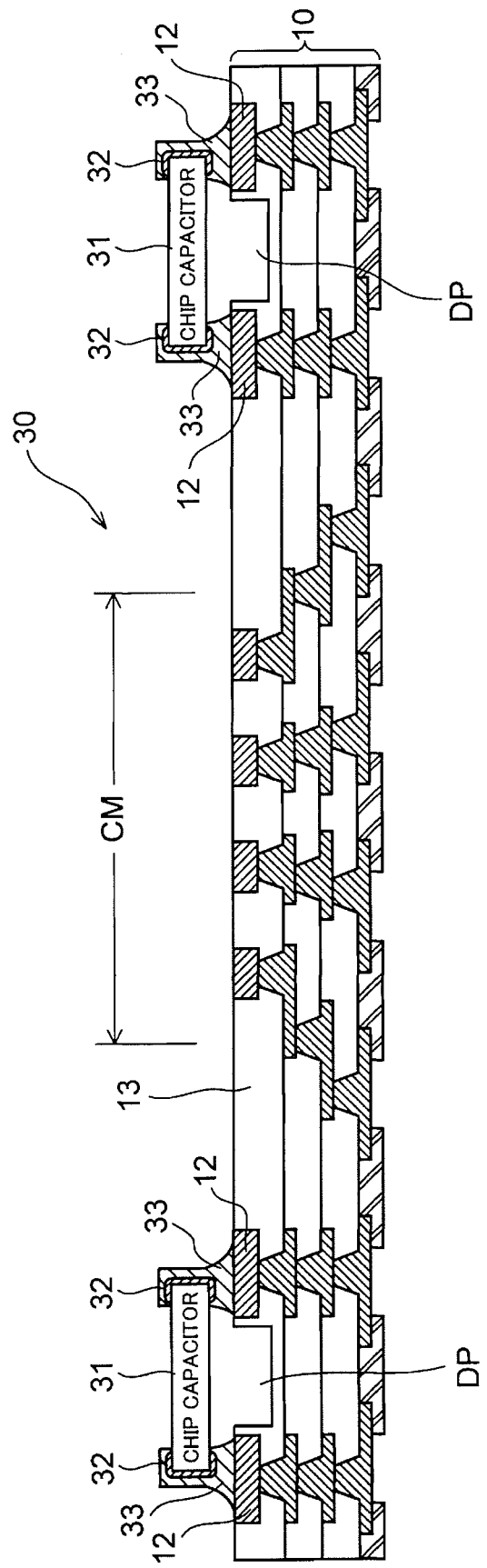
FIG. 2 is a cross-sectional view illustrating a configuration of a chip capacitor mounting board as a modified example of the wiring board illustrated in FIG. 1.

On the wiring board (package) 10 of the present embodiment, the electrode terminals of the semiconductor element (chip) and the electrode terminals of the chip capacitors are to be connected to the pads 11 and the pads 12, respectively, which are exposed from the chip mounting surface of the package 10 as described above. Moreover, external connection terminals are to be bonded to the pads 21P exposed from the other side surface of the package 10. FIG. 2 illustrates an example of the case.

The example in FIG. 2 illustrates a cross-sectional structure of the state where chip capacitors 31 are mounted on the wiring board 10 (chip capacitor mounting board 30). Each of the chip capacitors 31 has its electrode terminals 32 connected to the pads 12 on the wiring board 10 via the respective solder 33. The recessed portion DP is formed to have a predetermined depth in the insulating layer 13 at the portion where the chip capacitor 31 is mounted.

Figure 3A:
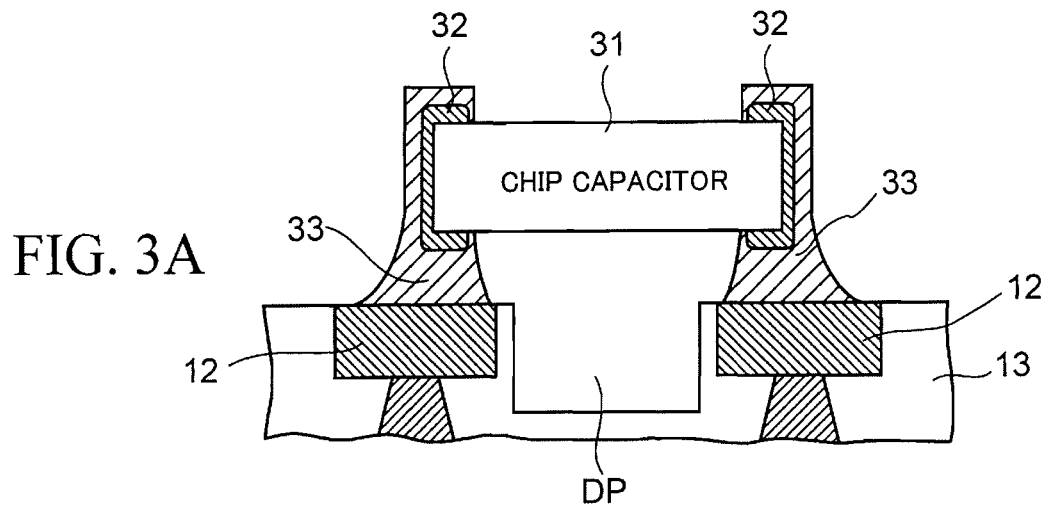
FIGS. 3A and 3B are views illustrating a chip capacitor mounting portion on the board illustrated in FIG. 1, FIG. 3A being a cross-sectional view of the chip capacitor mounting portion, and FIG. 3B being a plan view thereof.
Figure 3B:
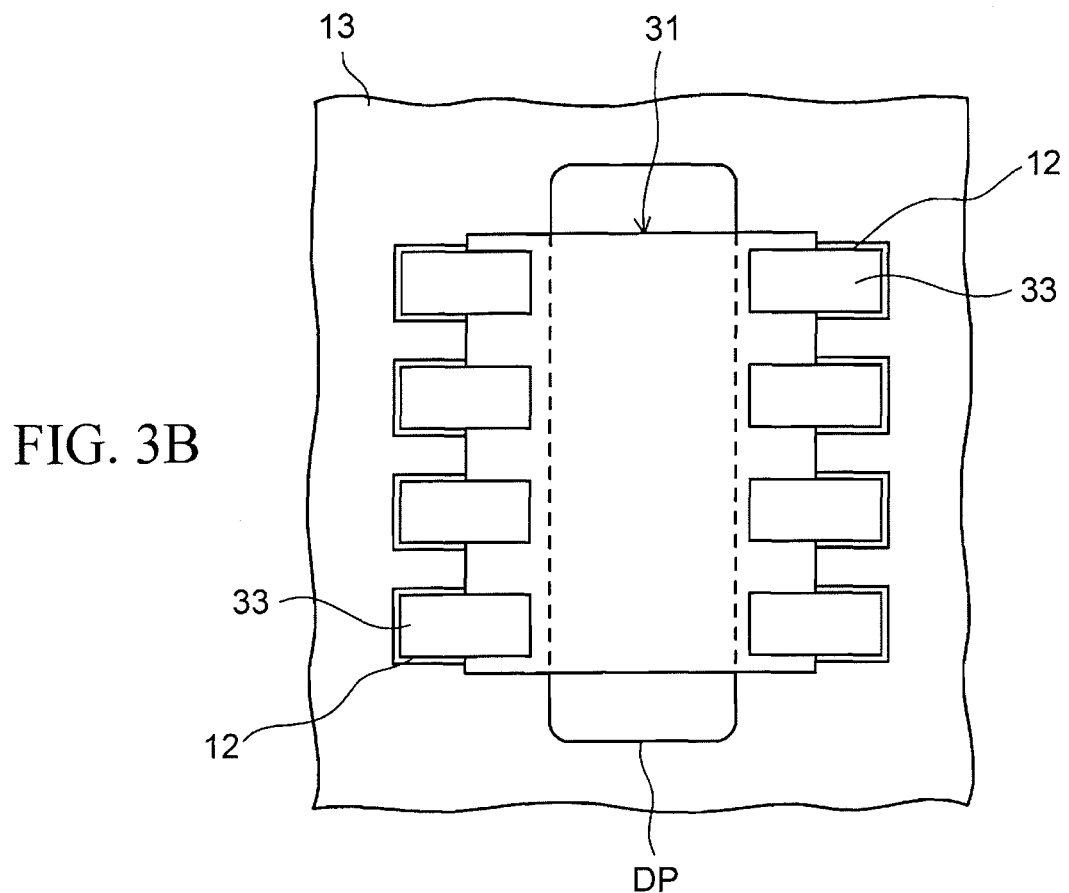

FIGS. 3A and 3B illustrate the chip capacitor mounting portion. FIG. 3A schematically illustrates the configuration when the portion is viewed in cross section, and FIG. 3B schematically illustrates the configuration when the portion is viewed from above. The recessed portion DP formed at the chip capacitor mounting portion is formed at the portion of the insulating layer 13 immediately below each of the capacitors, i.e., an area on the inner side of the pads 12 (area between the pads 12 facing each other on the insulating layer 13) to which the electrode terminals 32 facing each other of the chip capacitor 31 to be mounted are connected via the solders 33, respectively. In the example illustrated in FIG. 3B, the recessed portion DP is formed in a rectangular shape along the longitudinal direction (vertical direction in the drawing) of the chip capacitor 31 of a rectangular shape, and extends to the outside of the mounting area for the chip capacitor 31.

The size of the recessed portion DP is selected to be approximately 2.0 mm×0.2 mm in the plan view, and the depth of the recessed portion DP in this case is selected to be approximately 10 to 100 μm. The size of the chip capacitor 31 is selected to be, for example, 1.0 mm×0.5 mm×0.3 mm (thickness), 1.6 mm×0.8 mm×0.8 mm (thickness) or the like. The chip capacitor 31 has a cubic capacitor body made of ceramic and has the electrode terminals 32 on opposite side surfaces of the capacitor body.

The gap between the chip capacitor 31 and the surface of the package (the surface portion of the insulating layer 13 where the recessed portion DP is formed, i.e., the bottom surface of the recessed portion DP) is made relatively wide by forming the recessed portion DP at the position of the outermost insulating layer 13 in the manner described above.

Figure 4:
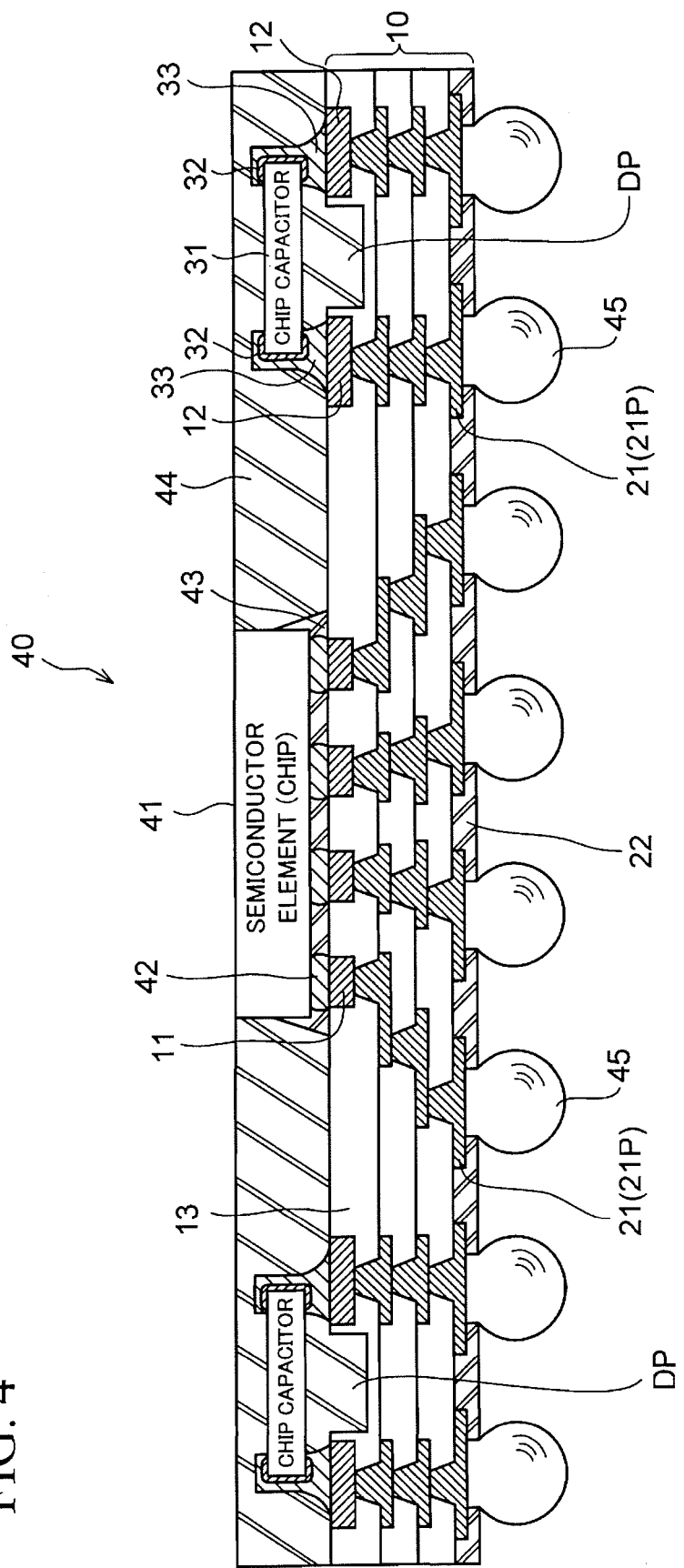
FIG. 4 is a cross-sectional view illustrating a configuration (semiconductor device) of the case where a semiconductor element (chip) is mounted on the chip capacitor mounting board illustrated in FIG. 2.

FIG. 4 illustrates a cross-sectional structure of a semiconductor device 40 formed by mounting a semiconductor element (chip) 41 on the chip capacitor mounting board 30 (the board formed by mounting the chip capacitors 31 on the wiring board 10) illustrated in FIG. 2. The semiconductor chip 41 has electrode terminals (not illustrated) electrically connected to the respective pads 11 on the wiring board 10 via solder bumps 42 or the like. Moreover, the space between the wiring board 10 and the semiconductor chip 41 mounted thereon is filled with an underfill resin 43 (thermosetting epoxy resin or the like). Then, the underfill resin 43 is cured, whereby the connection reliability between the chip 41 and the wiring board 10 is increased.

After the semiconductor chip 41 is mounted on the chip capacitor mounting board 30 (the board formed by mounting the chip capacitors 31 on the wiring board 10) as described above, the board is entirely encapsulated with a molding resin 44, which is an encapsulating resin, in such a manner that the chip capacitors 31 and the exposed conductor portions of the chip capacitors 31 (portions of the solder 33 connecting the electrode terminals 32 to the respective pads 12) are covered. On the other hand, the semiconductor chip 41 is not entirely encapsulated with the molding resin 44, and the surface of the semiconductor chip 41 opposite to the surface where the electrode terminals are formed is exposed. By this structure, the heat generated during operation of the semiconductor chip 41 can be dissipated directly into the atmosphere.

During the encapsulating with the molding resin 44, a portion of the molding resin 44 is filled in the gaps between the chip capacitors 31 and the wiring board 10. Since the gaps between the chip capacitors 31 and the surface of the wiring board 10 (the surface portions of the insulating layer 13 where the recessed portions DP are formed) are made relatively wide, the molding resin 44 easily flow into the gaps. As a result, the molding resin 44 injected into the gaps is completely filled in the gaps without generating voids (air bubbles).

On the other hand, solder balls 45 are bonded by reflow soldering to the pads 21P on the external connection surface side of the wiring board 10. In the illustrated example, a ball grid array (BGA) in which the solder balls 45 are bonded to the pads 21P is employed, but a pin grid array (PGA) in which pins are bonded to the pads may be employed instead. Alternatively, a land grid array (LGA) may be employed, in which the pads are left exposed, and the pads themselves are used as the external connection terminals.

Next, a method of manufacturing the wiring board 10 (FIG. 1) according to the first embodiment is described with reference to FIGS. 5A to 7C, which illustrate an example of the manufacturing steps of the method. Note, the step diagrams in FIGS. 5A to 7C only illustrate a portion (primary portion) of the wiring board 10 to be formed.

To begin with, in the first step (see FIG. 5A), a support base member 51 serving as a temporary board is prepared. Then, after a plating resist is formed using a patterning material on the support base member 51, openings are formed on required positions of the plating resist (formation of a resist layer 52 provided with opening portion OP1). The opening portion OP1 is patterned at a predetermined place around the chip mounting area CM (chip capacitor mounting portion) in accordance with the shape (rectangular shape exemplified in FIG. 3B) of a recessed portion DP to be eventually formed at the outermost insulating layer 13 on the chip mounting surface side.

As a material of the support base member (temporary substrate) 51, a metal soluble in an etching solution (typically, copper (Cu)) is used considering that the support base member is eventually subjected to etching. As the form of the support base member 51, a metal plate or metal foil is basically sufficient. It is possible to use, for example, the temporary substrate used in "Method of Manufacturing Wiring Board and Method of Manufacturing Electronic Component Mounted Structure" (Japanese Laid-open Patent Publication No. 2007-158174) previously proposed by the applicant of the present application. Specifically, it is possible to preferably use as the support base member 51a structure obtained by stacking an underlying layer and a copper foil on a prepreg (a bonding sheet in a semi-cured B stage, formed by impregnating a thermosetting resin such as an epoxy-based resin, a polyimide-based resin or the like into glass cloth that is a reinforcement material) and then applying heat and pressure to the prepreg. In this embodiment, the thickness of the support base member 51 is selected to be approximately 150 μm.

As a patterning material for forming the plating resist, a photosensitive dry film (of a structure in which the resist material is held between a polyester cover sheet and a polyethylene separator sheet) can be preferably used. To be more specific, after the surface of the support base member 51 is cleansed, the dry film is laminated thereon by thermal compression bonding. Then, the dry film is cured by exposure to ultraviolet (IN) radiation using a mask (not illustrated) patterned in a required shape. Then, the selected portion is etched by use of a predetermined developer (formation of the opening portion OP1). Thus, the resist layer 52 in accordance with the recessed portion DP of a required shape can be formed.

Instead of using a dry film, a liquid photoresist (liquid resist such as a novolac-based resin, an epoxy-based resin or the like) may be used. In this case as well, the resist layer 52 provided with the opening portion OP1 can be formed through the same steps as the aforementioned steps.

In the next step (see FIG. 5D), a sacrificial conductor layer 53 having a required thickness is formed on the support base member 51 exposed through the opening portion OP1 of the resist layer 52, by electrolytic plating using the support base member 51 as a power feeding layer. Considering that the sacrificial conductor layer 53 is eventually etched with the support base member 51 to which the sacrificial conductor layer 53 contacts, a metal soluble in the etching solution is selected as a constituent material of the sacrificial conductor layer 53. In this embodiment, since copper (Cu) is used as the material of the support base member 51, the sacrificial conductor layer (Cu) 53 is formed by application of electrolytic Cu plating on the support base member 51.

When the same material as the material of the support base member 51 is selected for the sacrificial conductor layer 53 as described above, these component members 51 and 53 can be simultaneously removed by a single processing during the etching to be performed eventually. Such simultaneous removal of the component members contributes to simplification of the process.

The required thickness of the sacrificial conductor layer 53 defines the depth of the recessed portion DP to be formed. Accordingly, the thickness of the sacrificial conductor layer 53 (depth of the recessed portion DP) is selected to secure a gap between the surface of the package and each of the chip capacitors 31 large enough to prevent formation of voids in the resin filled in the gap in the process of encapsulating the mounted chip capacitors 31 with the resin (see FIG. 4).

Note that, the cross section of the sacrificial conductor layer 53 is illustrated as a complete rectangular shape in the illustrated example, but the sacrificial conductor layer 53 actually has a shape in which corner portions of the upper surface and the side surfaces thereof are rounded (R). To be more specific, the upper surface of the sacrificial conductor layer 53 to be a gently curved surface protruding above. Thus, the cross-sectional shape of the recessed portion DP to be eventually formed by the sacrificial conductor layer 53 also has a shape in which corner portions of the bottom surface and the side surfaces of the recessed portion DP are rounded (R). Accordingly, the bottom surface of the recessed portion DP is formed to be a gently curved surface protruding downward. Since the corner portions are rounded (R), there is an advantage in that voids can be easily released in the process of encapsulating with resin.

In the next step (see FIG. 5C), the plating resist (the resist layer 52 in FIG. 5B) is removed. In the case where a dry film is used as the plating resist, an alkaline chemical solution such as sodium hydroxide or monoethanolamine can be used for removal. In the case where a liquid resist such as a novolac-based resin, an epoxy-based resin or the like is used, acetone or alcohol or the like can be used for removal.

Figure 5A:
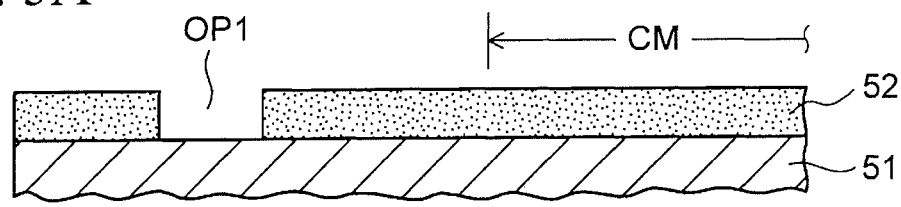
FIGS. 5A to 5D are cross-sectional views illustrating an example of manufacturing steps of the wiring board illustrated in FIG. 1.
Figure 5B:
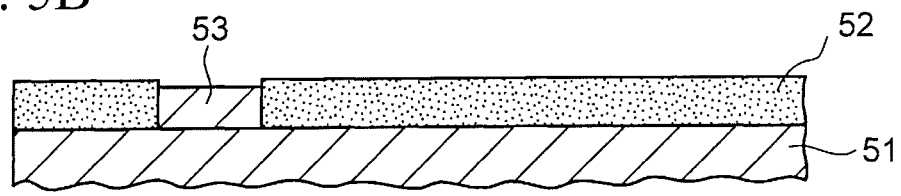

In the next step (see FIG. 5D), in the same manner as the processing in the step illustrated in FIG. 5A, a plating resist is formed using a patterning material on the surface of the support base member 51 where the sacrificial conductor layer 53 is formed. Thereafter, required positions of the plating resist are removed (formation of a resist layer 54 provided with two kinds of opening portions OP2 and OP3). As the patterning material, a photosensitive dry film or a liquid photosensitive film can be used as in the aforementioned case.

The opening portions OP2 are patterned in accordance with the required shape of the pads 12 to be formed and are formed at predetermined places around the chip mounting area CM (at both sides of the sacrificial conductor layer 53). On the other hand, the opening portions OP3 are patterned in accordance with the required shape of the pads 11 to be formed and are formed at predetermined places in the chip mounting area CM. In this embodiment, the pads 11 to be arranged in the chip mounting area CM are each designed to have a circular shape in the plan view with a diameter of approximately 50 to 150 µm. The pads 12 to be arranged around the chip mounting area CM are each designed to have a rectangular shape in the plan view with a size of approximately 0.5 mm×0.2 mm.

In the next step (see FIG. 6A), the pads 11 used for mounting a semiconductor element and the pads 12 used for mounting a chip capacitor are formed on the support base member 51 exposed through the opening portions OP2 and OP3 (FIG. 5D) formed in the resist layer 54, by electrolytic plating using the support base member 51 as a power feeding layer.

The pads 11 and 12 each have a structure obtained by stacking a plurality of metal layers. As a constituent material of the lowermost metal layer of the pads 11 and 12 (metal layer on the surface side to be exposed eventually), considering that the support base member 51 to be in contact with the lowermost layer is eventually etched, a metal insoluble in the etching solution is selected. In this embodiment, since copper (Cu) is used as the material of the support base member 51, gold (Au), a metal different from copper, is used considering that it can ensure good contact properties (soldering properties).

To be more specific, an Au layer M1 having a thickness of approximately 40 nm is first formed on the support base member (Cu) 51 by flash plating with Au, and then, a Pd layer M2 having a thickness of approximately 20 nm is formed on the Au layer M1 by flash plating with palladium (Pd). Then, a Ni layer M3 having a thickness of approximately 5 µm is formed on the Pd layer M2 by nickel (Ni) plating, and finally, a Cu layer M4 having a thickness of approximately 15 µm is formed on the Ni layer M3 by copper (Cu) plating. The Ni layer M3 serves as a barrier metal layer for preventing copper (Cu) contained in the metal layer formed on the Ni layer M3 from diffusing into the Pd layer M2 and the Au layer M1, which are the lower layers of the Ni layer M3.

In other words, in this step, the pads 11 and 12 are each formed of a four-layer structure of Au/Pd/Ni/Cu. In this step, the Pd layer M2 is interposed between the Au layer M1, which is the lowermost layer, and the barrier metal layer (Ni layer M3), but the Pd layer M2 does not have to be formed. In this case, the pads 11 and 12 are each formed of a three-layer structure of Au/Ni/Cu.

Figure 5C:

In the next step (see FIG. 6B), the plating resist (resist layer 54 in FIG. 6A) is removed in the same manner as the processing performed in the step illustrated in FIG. 5C.

In the next step (see FIG. 6C), an insulating layer 13 formed of an epoxy-based resin, a polyimide-based resin or the like is formed on the surface of the support base member 51 where the pads 11 and 12 are formed. For example, the insulating layer 13 can be formed by laminating an epoxy-based resin film on the support base member 51 (sacrificial conductor layer 53) and the pads 11 and 12 and then curing the epoxy-based resin film by heat processing at a temperature of 130 to 150° C. while the resin film is pressed.

In the next step (see FIG. 7A), a first build up layer (wiring layer 15) is formed on the insulating layer 13.

First, opening portions (via holes VH1) extending to the pads 11 and 12 are formed at predetermined positions (portions corresponding to the pads 11 and 12) of the insulating layer 13, respectively, by a hole making process with a carbon dioxide gas laser, an excimer laser, a UV-YAG laser or the like. In this step, the via holes VH1 are formed by a laser, but the via holes VH1 may be formed by photolithography in the case where the insulating layer 13 is formed of a photosensitive resin. Each of the via holes VH1 is formed in a recessed portion in the form of a truncated cone. The recessed portion has a bottom surface which is an underlying wiring layer or a pad, and is opened toward the external connection surface side. The diameter of the opening side is larger than that of the bottom surface.

Next, the wiring layer 15 of a required pattern to be connected to the pads 11 and 12 is formed by filling the via holes VH1 (formation of vias 14) on the insulating layer 13 having the via holes VH1 formed therein. For example, a semi-additive process is used for formation of the wiring layer 15.

To be more specific, a copper (Cu) seed layer (not illustrated) is formed on the insulating layer 13 and also in the via holes VH1 by electroless plating, sputtering or the like, first. Then, a resist film (not illustrated) is formed, which is provided with opening portions in accordance with the shape of the wiring layer 15 to be formed. Next, a conductor (Cu) pattern (not illustrated) is formed on the seed layer (Cu) exposed through the opening portions of the resist film by electrolytic Cu plating using the seed layer as a power feeding layer. Furthermore, the seed layer is etched by using the conductor (Cu) pattern as a mask after the resist film is removed. Thus, the required wiring layer 15 is obtained.

Note that, other than the aforementioned semi-additive process, various wiring forming methods including a subtractive process and the like can be used. In addition, the method of forming the vias 14 is not limited to electroless plating or the like. The vias 14 can be formed by filling the holes with a conductive paste (silver paste, copper paste or the like) by a screen printing method.

Figure 6A:
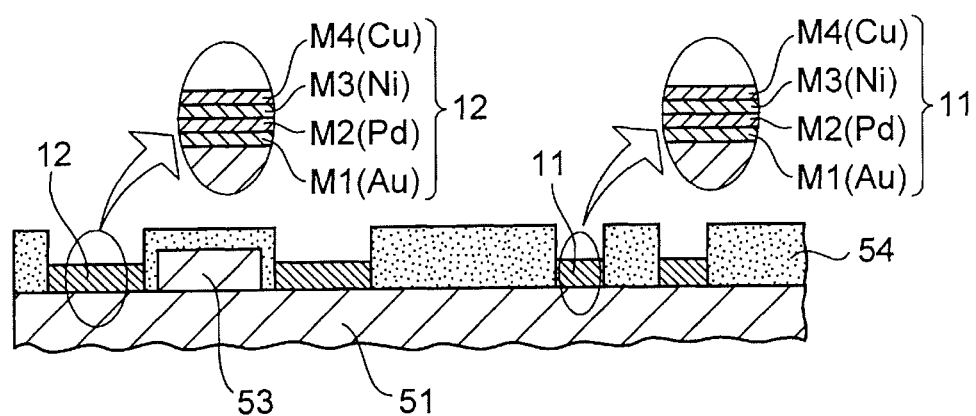
FIGS. 6A to 6C are cross-sectional views illustrating manufacturing steps subsequent to the steps illustrated in FIGS. 5A to 5D.
Figure 6B:
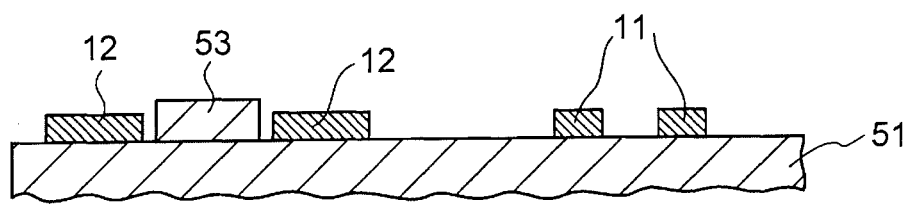
Figure 6C:
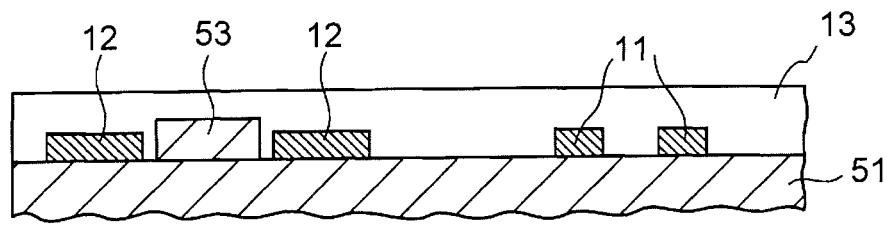
Figure 7A:
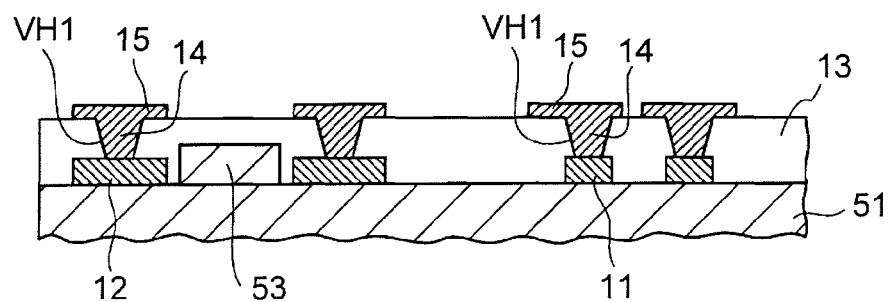
FIGS. 7A to 7C are cross-sectional views illustrating manufacturing steps subsequent to the steps illustrated in FIGS. 6A to 6C.
Figure 7B:
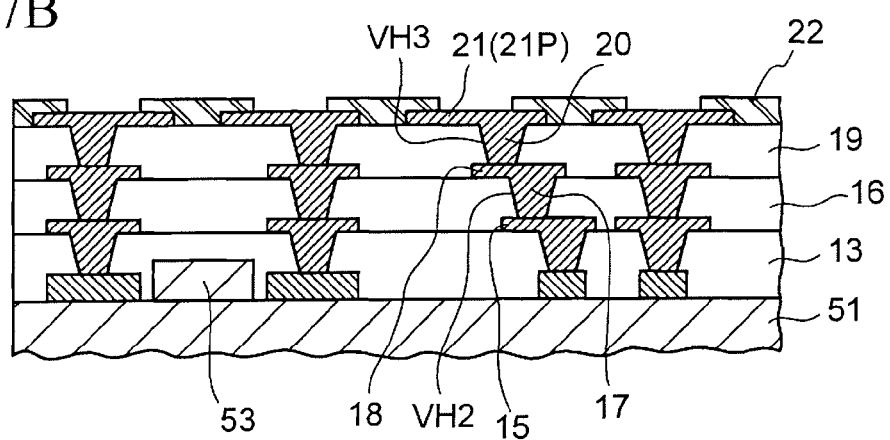

In the next step (see FIG. 7B), the insulating layers and the wiring layers are alternately stacked by repeating the processing performed in the steps in FIGS. 6C and 7A. In the illustrated example, only two insulating layers and two wiring layers are stacked for the simplicity of description. Namely, an insulating layer 16 is formed on the insulating layer 13 and the wiring layer 15. Then, the via holes VH2, which extend to the respective pads (not illustrated) of the wiring layer 15 are formed on the insulating layer 16. Thereafter, the wiring layer 18 of a required pattern connected to the pads is formed by filling the via holes VH2 (formation of the vias 17). Moreover, an insulating layer 19 is formed on the insulating layer 16 and the wiring layer 18. Then, the via holes VH3, which extend to the respective pads (not illustrated) of the wiring layer 18 are formed in the insulating layer 19. Thereafter, the wiring layer 21 of a required pattern connected to the pads is formed by filling the via holes VH3 (formation of the vias 20). The wiring layer 21 is the outermost wiring layer in this embodiment.

Moreover, the solder resist layer 22 is formed to cover the surface (insulating layer 19 and wiring layer 21) except for the portions of the pads 21P each defined at a predetermined position of the wiring layer 21. The solder resist layer 22 can be formed, for example, by laminating a solder resist film (or applying a liquid solder resist) onto the surface, and then patterning the resist in a required shape. In this manner, the pads 21P are exposed through the opening portions of the solder resist layer 22.

The pads 21P are preferably subjected to Au plating in order to increase the contact properties as in the case of the pads 11 and 12 on the chip mounting surface side. This is because external connection terminals such as solder balls or the like used for mounting the package 10 on a motherboard or the like are bonded to the respective pads 21P. During this process, Ni plating, Pd plating and Au plating are applied on the pads 21 in this order. Namely, a conductor layer having a three-layer structure (not illustrated) of Ni/Pd/Au is formed on the pads 21P.

In the final step (see FIG. 7C), the support base member 51 and the sacrificial conductor layer 53 are removed. For example, by wet etching using a solution such as a ferric chloride aqueous solution, a copper chloride aqueous solution, or an ammonium persulfate aqueous solution, the support base member 51 and the sacrificial conductor layer 53, which are formed of Cu, can be selectively etched from the pads 11, 12 and 21P (Au layer is formed on the surface layer portion thereof), the insulating layer 13 and the solder resist layer 22.

Through the aforementioned steps, the wiring board 10 (FIG. 1) of this embodiment is fabricated.

As described above, according to the first embodiment (FIGS. 1 to 7C), there is provided the wiring board (semiconductor package) 10 having the following configuration or a chip capacitor mounting board 30 formed by mounting the chip capacitors 31 on this package 10. In this configuration of the wiring board (semiconductor package) 10, the pads 11 used for mounting a semiconductor element and the pads 12 used for mounting a chip capacitor are exposed on the same surface as the surface of the insulating layer 13, which is the outermost layer on the chip mounting surface side. In addition, each of the recessed portions DP having a required depth is formed at the area between a pair of the pads 12, which face each other on the chip capacitor mounting portion of the insulating layer 13.

According to the configuration of the wiring board (semiconductor package) 10, the gaps between the chip capacitors 31 and the surface of the board (surface portions of the insulating layer 13 where the recessed portions DP are formed) are formed relatively wide. Thus, when the board is entirely encapsulated with the molding resin 44 after the chip capacitors 31 are mounted on the wiring board 10, the resin 44 easily flows into the gaps between the chip capacitors 31 and the surface of the board (portions where the cross-sectional areas are made wide). As a result, the resin 44 injected into the gaps is completely filled in the gaps without generating voids (air bubbles). Accordingly, the inconvenience such as a short defect caused by a chip capacitor as observed in the related art can be solved, and the insulation reliability can be thus improved.

In the process (method of manufacturing the wiring board) according to the aforementioned first embodiment, the case where the recessed portions DP are formed on the basis of plating on the support base member 51 (formation of the sacrificial conductor layer 53) and removal of the plating layer is described as an example. It is a matter of course, however, that the method of forming the recessed portions DP is not limited to the aforementioned method. For example, it is also possible to form the recessed portions DP by half etching. The process of the case is basically the same as the processing performed in the process (FIGS. 5A to 7C) according to the first embodiment except for processing related to the half etching. Hereinafter, a description is given of the processing using the half etching with reference to FIGS. 8A to 8D.

First (see FIG. 8A), in the same manner as the processing performed in the step illustrated in FIG. 5A, a temporary substrate (support base member) 51a is prepared, and an etching resist is formed on the support base member 51a, using a photosensitive dry film or the like. Then, the etching resist is patterned in a required shape to form a resist layer 52a. The resist layer 52a is formed in a pattern reverse to the pattern of the resist layer 52 illustrated in FIG. 5A.

Specifically, the resist layer 52a is patterned in such a manner that only a resist portion corresponding to the shape of the recessed portion DP (FIG. 3B) to be formed at the outermost insulating layer 13 remains left.

Next, using the patterned resist layer 52a as a mask, half-etching is performed on exposed portions of the support base member 51a. Then, the exposed portions are removed down to a required depth (the amount corresponding to the depth of the recessed portions DP to be formed). Thus, a support base member 51b having a step portion as illustrated is formed. Then, after removal of the resist layer (etching resist) 52a (see FIG. 8C), in the same manner as the processing performed in the step illustrated in FIG. 5D, a resist layer 54 provided with the opening portions OP2 and OP3 is formed on the surface side of the support base member 51b where the step portion is formed (see FIG. 8D). Thereafter, the wiring board 10 illustrated in FIG. 1 can be obtained through the same processing as that performed in each of the steps at and after the step illustrated in FIG. 6A.

As described above, the recessed portions DP can be formed by half-etching. However, as another method, a sandblasting method, a wet blasting method or the like may be used instead of half-etching.

Moreover, in the process according to the first embodiment, the case where the pads 11 and 12 are formed (FIG. 5D to FIG. 6B) after the sacrificial conductor layer 53 in accordance with the depth of the recessed portions DP is formed (FIG. 5A to FIG. 5C) on the support base member 51 is described as an example. However, the sequence of the steps in the process is not necessarily limited to the aforementioned sequence. The sequence of the patterning steps (formation of the sacrificial conductor layer 53 and formation of the pads 11 and 12 on the support base member 51) may be switched. In other words, even when the sacrificial conductor layer 53 in accordance with the depth of the recessed portions DP is formed on the support base member 51 after the pads 11 and 12 are formed on the support base member 51, the wiring board 10 (FIG. 1) having the same configuration can be obtained eventually.

Figure 9:
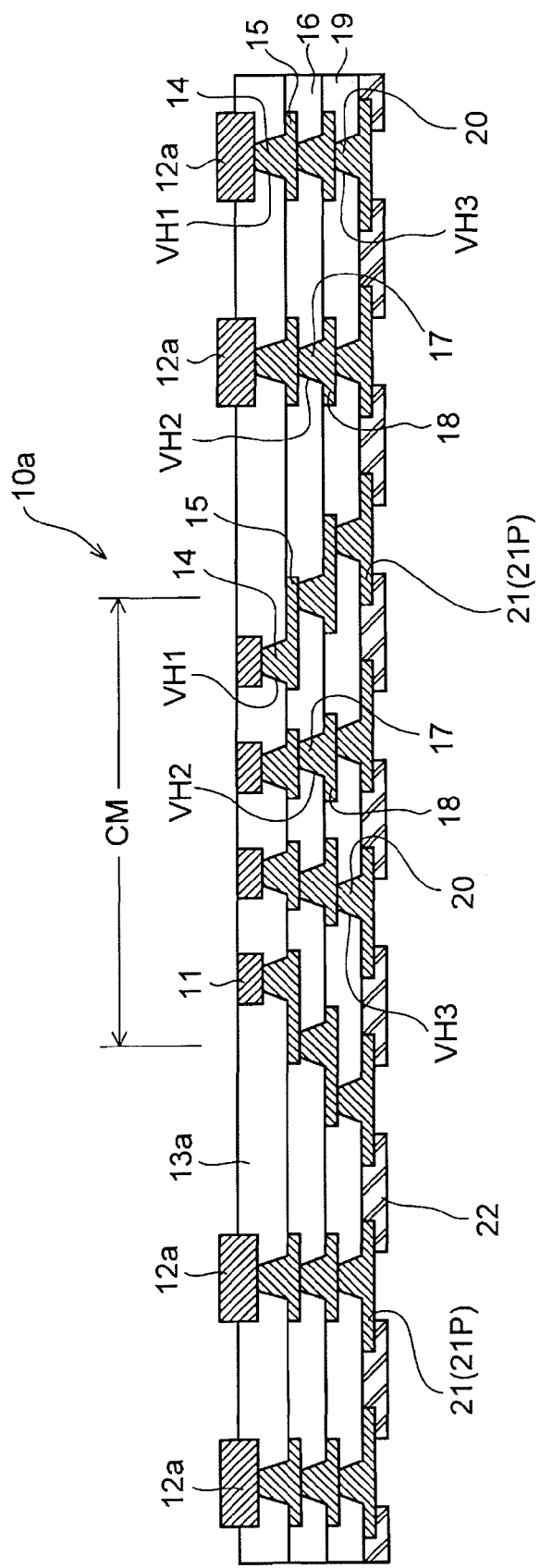
FIG. 9 is a cross-sectional view illustrating a configuration of a wiring board (semiconductor package) according to a second embodiment.

FIG. 9 illustrates in a cross-sectional view, a configuration of a wiring board (semiconductor package) according to a second embodiment.

As compared with the configuration of the wiring board 10 (FIG. 1) according to the first embodiment, the wiring board (semiconductor package) 10a according to the second embodiment is different in that the surface of an insulating layer 13a, which is the outermost layer on the chip mounting surface side thereof, is flat (i.e., the recessed portions DP as provided in the first embodiment are not provided), and in that pads 12a used for mounting a chip capacitor protrudes from the surface of the package. The other configuration of the wiring board 10a is basically the same as that of the wiring board 10 of the first embodiment, and thus the description thereof is omitted.

In the aforementioned first embodiment, the gaps between the chip capacitors 31 and the surface of the package (the surface of the insulating layer 13) are made relatively wide by providing the recessed portions DP at the predetermined positions of the insulating layer 13, which is the outermost layer. On the contrary, in the second embodiment, the gaps between the chip capacitors 31 and the surface of the package (the surface of the insulating layer 13a) are made relatively wide by causing the upper surfaces of the pads 12a used for mounting a chip capacitor to protrude from the surface of the insulating layer 13a, which is the outermost layer.

Figure 10:
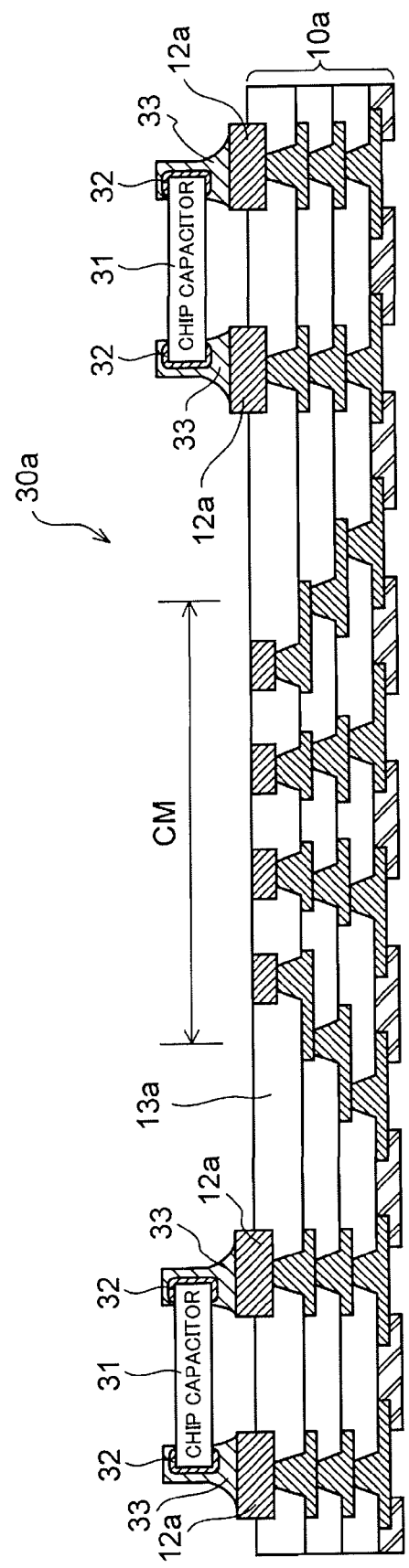
FIG. 10 is a cross-sectional view illustrating a configuration of a chip capacitor mounting board as a modified example of the wiring board illustrated in FIG. 9.

Moreover, in the wiring board (semiconductor package) 10a of the second embodiment as well, electrode terminals of a semiconductor element (chip) are to be connected to the pads 11 exposed from the chip mounting surface and electrode terminals of each of the chip capacitors are to be connected to the pads 12a, while external connection terminals are to be connected to the pads 21P exposed from the other surface of the wiring board 10a. FIG. 10 illustrates an example of the case.

The example illustrated in FIG. 10 illustrates a cross-sectional structure of the state (chip capacitor mounting board 30a) in which the chip capacitors 31 are mounted on the wiring board 10a. As illustrated, the electrode terminals 32 of each of the chip capacitors 31 are connected to the respective pads 12a (pads 12a protruding from the surface of the insulating layer 13a) on the wiring board 10a via the solder 33.

Figure 11A:
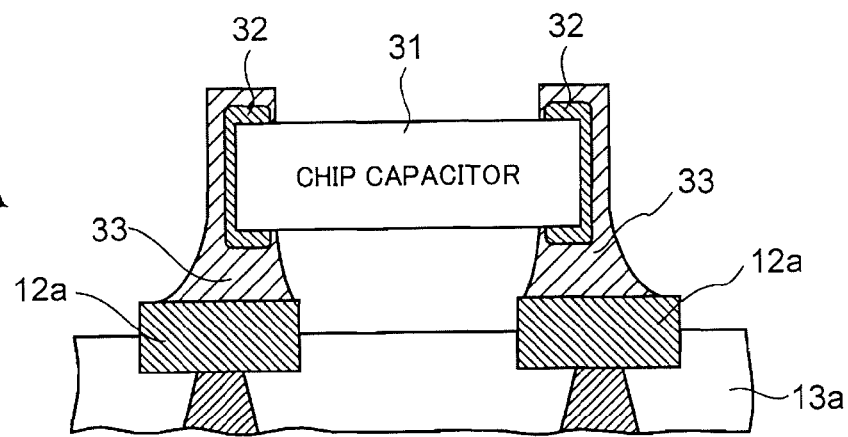
FIGS. 11A and 11B are views illustrating a chip capacitor mounting portion on the board illustrated in FIG. 10, FIG. 11A being a cross-sectional view of the chip capacitor mounting portion, and FIG. 11B being a plan view thereof.
Figure 11B:
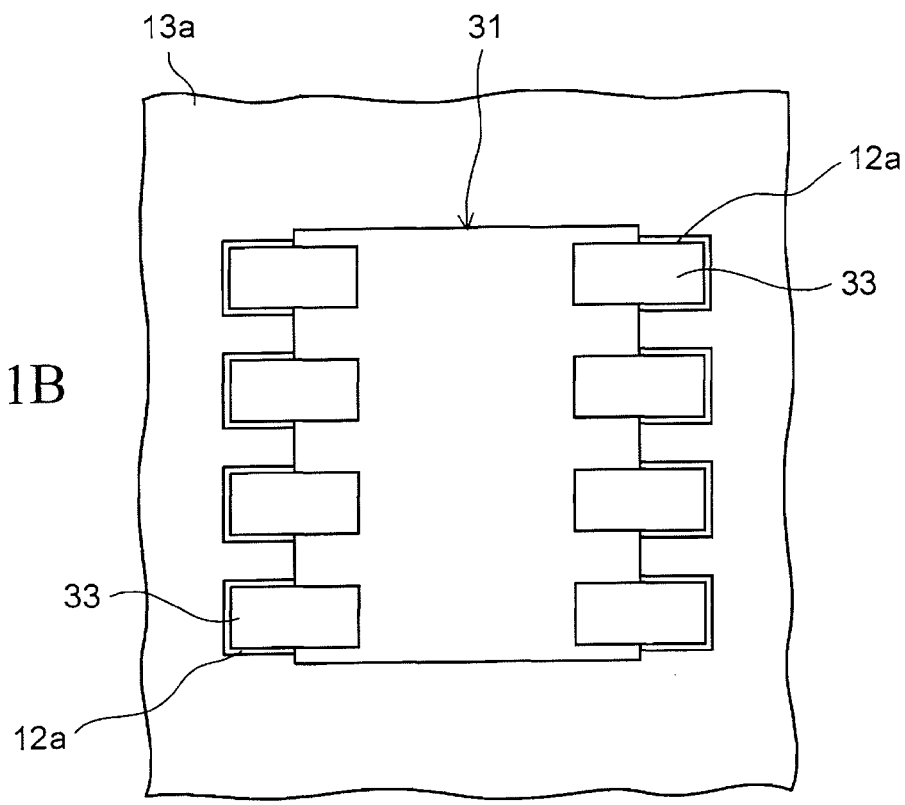

FIGS. 11A and 11B are views illustrating the chip capacitor mounting portion. FIG. 11A illustrates the configuration when the portion is viewed in cross-section, and FIG. 11B schematically illustrates the configuration when the portion is viewed from above. As illustrated in FIG. 11A, the gap between the chip capacitor 31 and the surface of the package (the surface of the insulating layer 13a) is made relatively wide by providing the pads 12a so as to protrude from the surface of the package (the surface of the insulating layer 13a).

Figure 12:
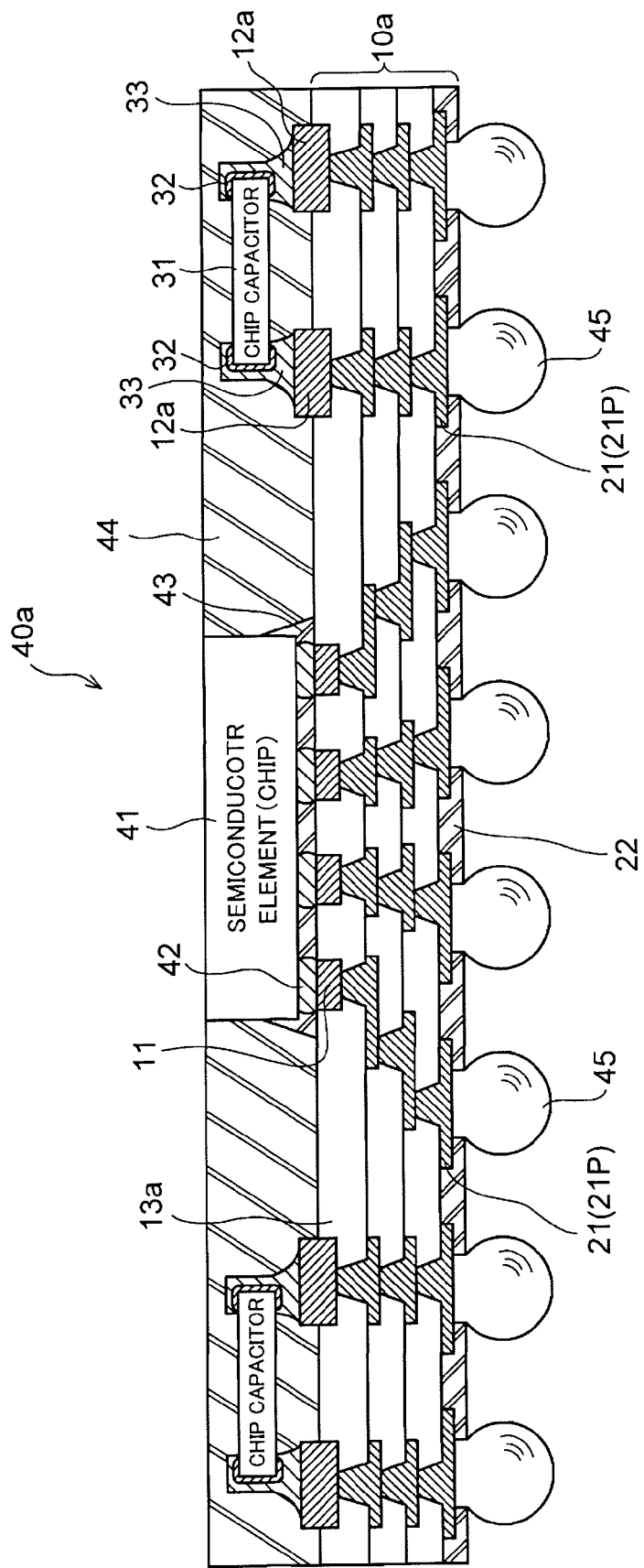
FIG. 12 is a cross-sectional view illustrating a configuration (semiconductor device) of the case where a semiconductor element (chip) is mounted on the chip capacitor mounting board illustrated in FIG. 10.
Figure 13A:
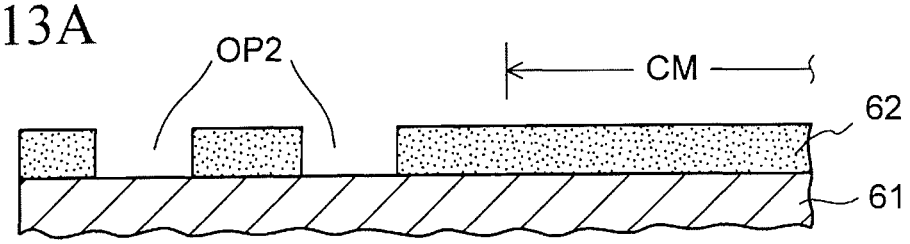
FIGS. 13A to 13D are cross-sectional views illustrating an example of manufacturing steps of the wiring board illustrated in FIG. 9.
Figure 13B:
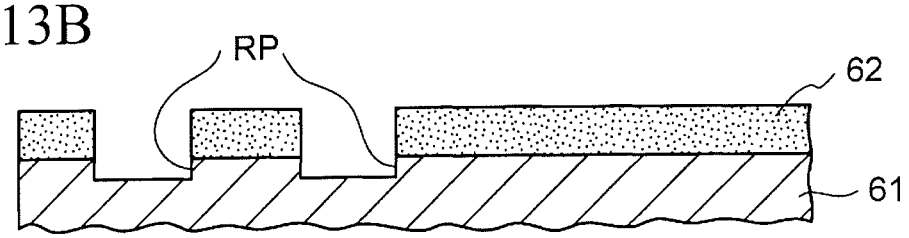
Figure 13C:
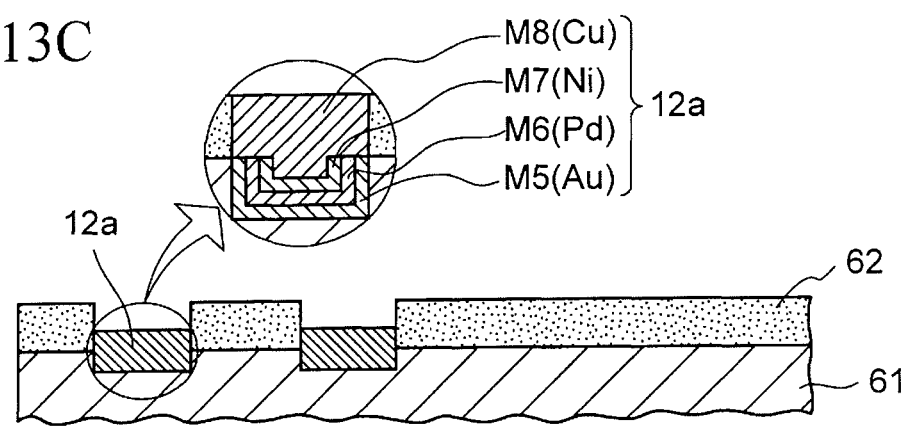
Figure 13D:
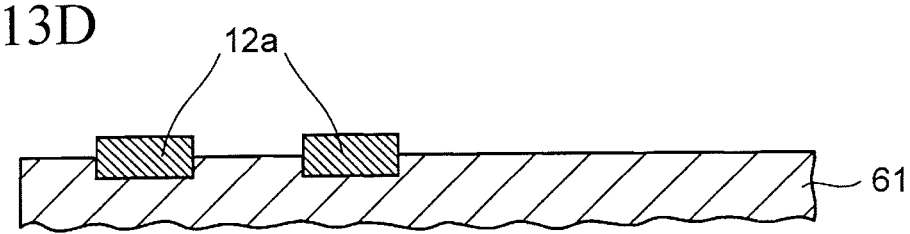
Figure 14A:
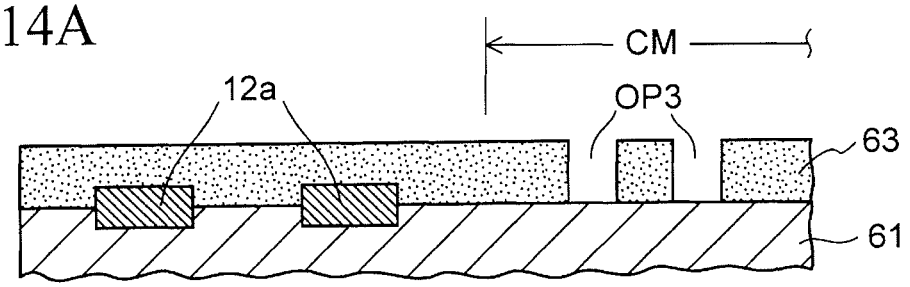
FIGS. 14A to 14C are cross-sectional views illustrating manufacturing steps subsequent to the steps illustrated in FIGS. 13A to 13D.
Figure 14B:
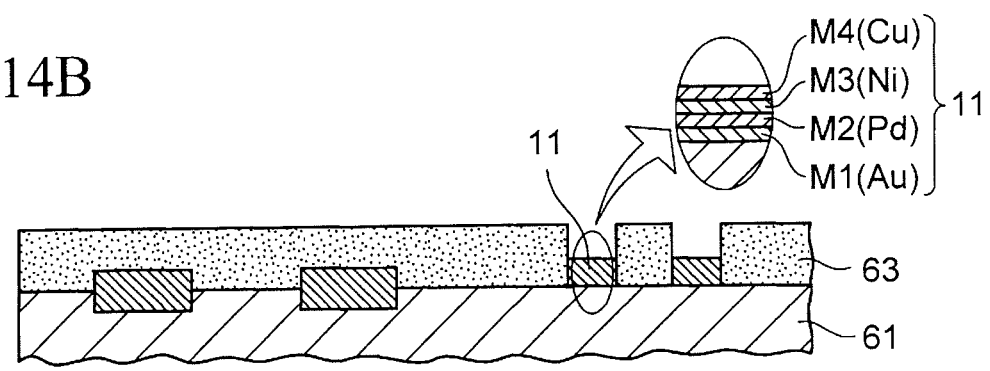
Figure 14C:
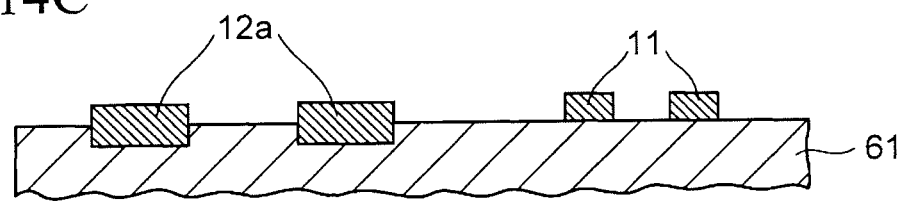

FIG. 12 illustrates a cross-sectional structure of the case where a semiconductor device 40a is constituted by mounting a semiconductor element (chip) 41 on the chip capacitor mounting board 30a (the board obtained by mounting the chip capacitors 31 on the wiring board 10a) illustrated in FIG. 10. The semiconductor device 40a basically has the same configuration as that of the semiconductor device 40 illustrated in FIG. 4 except that the surface of the insulating layer 13a, which is the outermost layer on the chip mounting surface side, is flat, and that the upper surface of each of the pads 12a protrudes from the surface of the insulating layer 13a in the wiring board 10a.

The wiring board 10a (FIG. 9) according to the second embodiment can be fabricated by the manufacturing steps illustrated in FIGS. 13A to 15C illustrated as an example. The processing performed in the steps illustrated in FIGS. 13A to 15C is basically the same as the processing performed in the steps (FIGS. 5A to 7C) according to the first embodiment. In order to avoid redundant description, a description is given while focusing on a different part of the processing.

To being with, in the first step (see FIG. 13A), a support base member 61 serving as a temporary board is prepared in the same manner as the processing performed in the step illustrated in FIG. 5A. Then, after a resist is formed using a patterning material on the support base member 61, openings are formed on the required positions of the resist (formation of the resist layer 62 provided with the opening portions OP2). The resist layer 62 is used for both etching and plating. In addition, as a patterning material, a photosensitive dry film or a liquid photoresist can be used as in the aforementioned case.

The opening portion OP2 to be formed is patterned in accordance with the shape of the pad 12a to be formed at the corresponding portion (chip capacitor mounting portion) at the periphery of the chip mounting area CM. The shape and size of each of the pads 12a in the plan view are the same as those in the first embodiment.

In the next step (see FIG. 13B), half-etching is performed on the portions of the support base member 61, which are exposed through the opening portions OP2, using the resist layer 62 provided with the patterned opening portions OP2, as a mask. Thus, the portions of the support base member 61 are etched down to a required depth so as to form recessed portions RP. The depth of each of the recessed portions RP defines the protrusion amount of the pad 12a to be formed (the distance by which the upper surface of the pad 12a protrudes from the surface of the insulating layer 13a).

Note that, the cross-sectional shape of each of the recessed portions RP is illustrated as a quadrangular shape in the illustrated example, but to be precise, the recessed portion RP has a shape in which corner portions thereof are slightly rounded. In addition, the recessed portions RP are formed by half-etching in this step, but another method such as a sandblasting method, a wet blasting method or the like may be used.

In the next step (see FIG. 13C), in the same manner as the processing performed in the step illustrated in FIG. 6A, the pads 12a used for mounting a chip capacitor are formed on the support base member 61 exposed through the opening portions OP2 (recessed portions RP) formed in the resist layer 62 (support base member 61), by electrolytic plating using the support base member 61 as a power feeding layer.

Each of the pads 12a to be formed has a structure in which a plurality of metal layers are stacked as in the case of the pads 12 in the first embodiment. Namely, the pads 12a each having a four-layer structure (Au/Pd/Ni/Cu) are formed by forming an Au layer M5, a Pd layer M6, a Ni layer M7 and a Cu layer M8 in this order on the support base member (Cu) 61. Alternatively, the pads 12a may be configured of a three-layer structure (Au/Ni/Cu) by omitting the Pd layer M6.

Note that, the pads 12a are formed in the respective recessed portions RP provided at the support base member 61, so that three layers (Au layer M5, Pd layer M6 and Ni layer M7) are formed in the recessed portion RP and the remaining one layer (Cu layer M8) is formed to protrude from the surface of the support base member 61.

In the next step (see FIG. 13D), the resist (the resist layer 62 in FIG. 13C) used for etching and plating is removed in the same manner as the processing performed in the step illustrated in FIG. 5C.

Figure 5D:
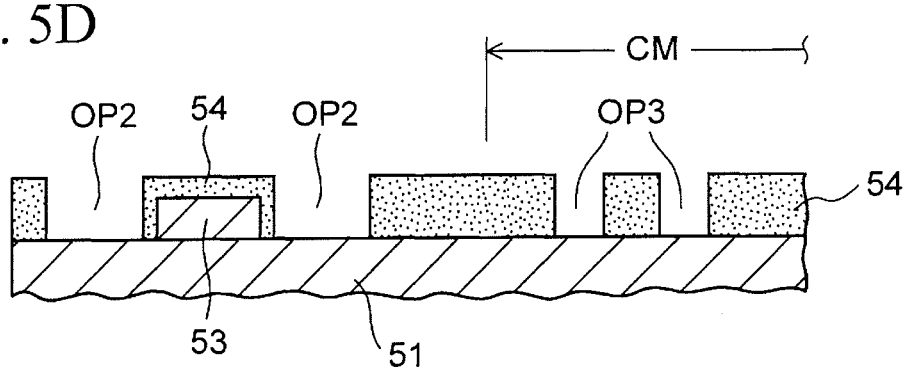

In the next step (see FIG. 14A), a plating resist is first formed using a patterning material on the surface of the support base member 61 where the pads 12a are formed, in the same manner as the processing performed in the step illustrated in FIG. 5D. Then, openings are formed at the required positions of the plating resist (formation of the resist layer 63 provided with the opening portions OP3). As a pattering material, it is possible to use a photosensitive dry film or a liquid photoresist as in the aforementioned case.

The opening portion OP3 to be formed is patterned in accordance with the required shape of the pad 11 to be formed at the corresponding portion in the chip mounting area CM. The shape and size of each of the pads 11 in the plan view are the same as those in the first embodiment.

In the next step (see FIG. 14B), in the same manner as the processing performed in the step illustrated in FIG. 6A, the pads 11 used for mounting a semiconductor chip are formed on the support base member 61 exposed through the opening portions OP3 (see FIG. 14A) formed in the resist layer 63, by electrolytic plating using the support base member 61 as a power feeding layer. Each of the pads 11 to be formed has a four-layer structure (Au/Pd/Ni/Cu) obtained by forming an Au layer M1, a Pd layer M2, a Ni layer M3 and a Cu layer M4 in this order on the support base member (Cu) 61 as in the case of the pads 11 in the first embodiment. In this case too, the pads 11 may be configured of a three-layer structure (Au/Ni/Cu) by omitting the Pd layer M2.

In the next step (see FIG. 14C), the plating resist (the resist layer 63 in FIG. 14B) is removed in the same manner as the processing performed in the step illustrated in FIG. 5C.

Figure 15A:
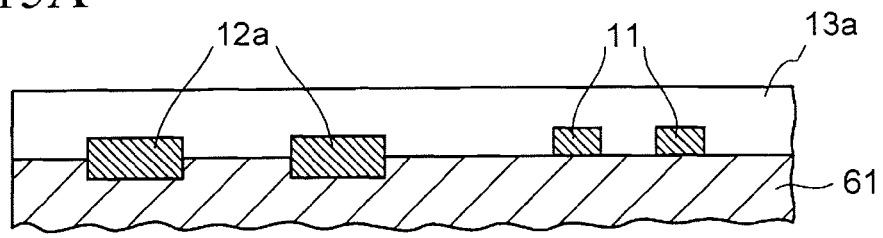
FIGS. 15A to 15C are cross-sectional views illustrating manufacturing steps subsequent to the steps illustrated in FIGS. 14A to 14C.
Figure 15B:
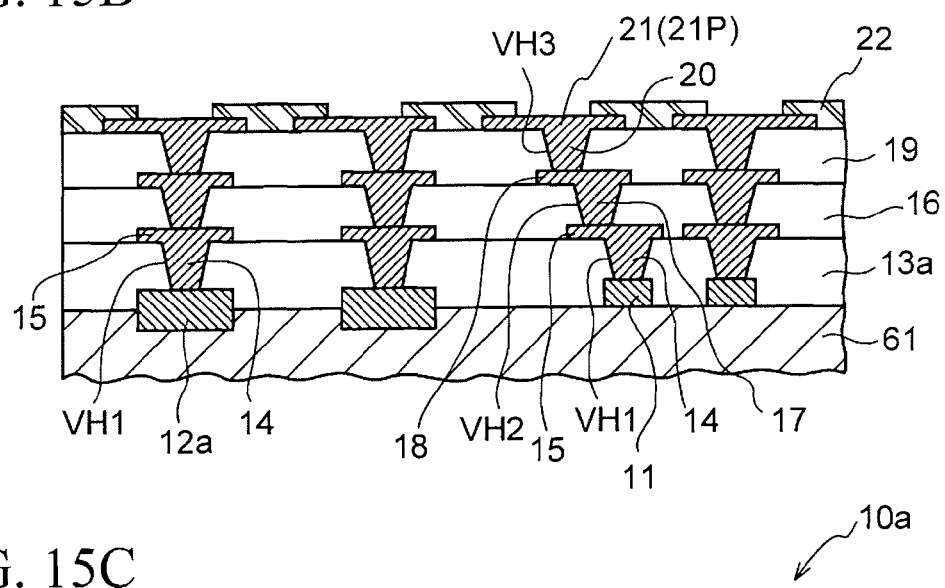
Figure 15C:
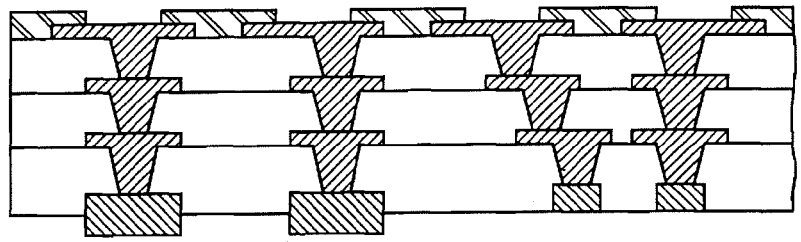

Thereafter, the same processing as the processing performed in the steps illustrated in FIGS. 6C to 7B is performed in the steps illustrated in FIGS. 15A and 15B.

Specifically, the insulating layer 13a is first formed on the surface of the support base member 61 where the pads 11 and 12a are formed. Then, after the via holes VH1 extending to the pads 11 and 12a are formed at the insulating layer 13a, the wiring layer 15 connected to the pads 11 and 12a is formed on the insulating layer 13a by filling the via holes VH1 (formation of vias 14). Thereafter, the insulating layer 16 is formed. Then, after the via holes VH2 are formed at the insulating layer 16, the wiring layer 18 is formed by filling the via holes VH2 (formation of vias 17) in the same manner described above. Thereafter, the insulating layer 19 is formed. Then, after the via holes VH3 are formed at the insulating layer 19, the wiring layer 21 is formed by filling the via holes VH3 (formation of vias 20). Moreover, the solder resist layer 22 is formed to cover the surface (the insulating layer 19 and the wiring layer 21) except for the portions of the pads 21P defined at the wiring layer 21. Then, the pads 21P are subjected to the required surface treatment (Ni/Pd/Au plating).

Figure 7C:
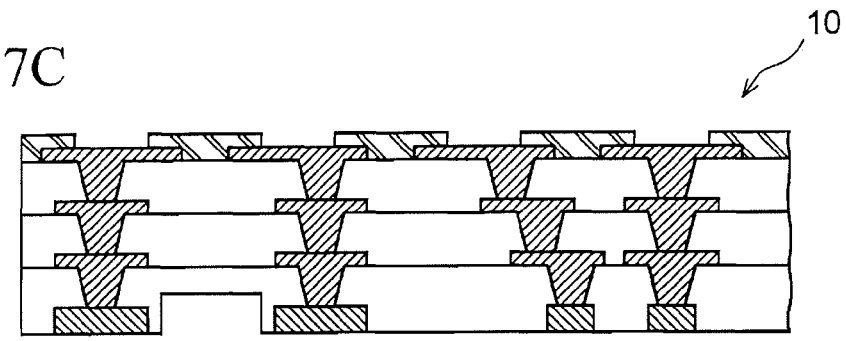
Figure 8A:
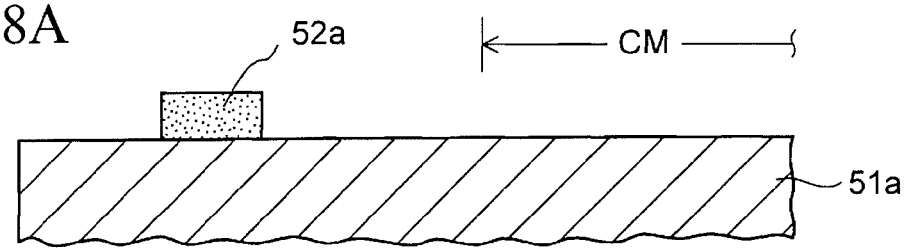
FIGS. 8A to 8D are cross-sectional views illustrating another example of manufacturing steps of the wiring board illustrated in FIG. 1.
Figure 8B:
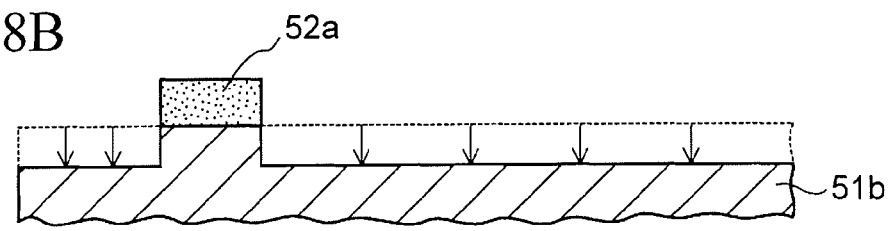
Figure 8C:
Figure 8D:
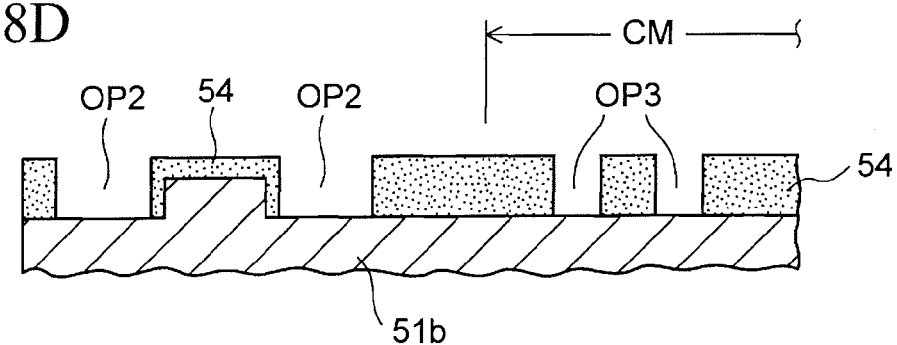

In the final step (see FIG. 15C), the support base member 61 is selectively etched from the pads 11, 12a and 21P, the insulating layer 13a and the solder resist 22 by use of the same technique used in the processing performed in the step illustrated in FIG. 7C.

Through the aforementioned steps, the wiring board 10a (FIG. 9) is fabricated.

As described above, according to the second embodiment (FIGS. 9 to 15C), there is provided the wiring board (semiconductor package) 10a having the following configuration or the chip capacitor mounting board 30a formed by mounting the chip capacitors 31 on the wiring board 10a. In the configuration of the wiring board (semiconductor package) 10a, the pads 11 used for mounting a semiconductor chip are exposed on the same surface as the surface of the insulating layer 13a, which is the outermost layer on the chip mounting surface side, and the pads 12a used for mounting a chip capacitor are exposed at a position higher than the surface of the insulating layer 13a.

According to the configuration of the wiring board 10a (30a), the upper surfaces of the pads 12a used for mounting a chip capacitor protrude from the surface of the insulating layer 13a, which is the outermost layer. As a result, the gap between each of the chip capacitors 31 and the surface of the board (the surface of the insulating layer 13a) is made relatively wide. Thus, as in the case of the first embodiment, when the board is entirely encapsulated with the molding resin 44 after the chip capacitors 31 are mounted on the board, the resin 44 easily flows into the gap (the portion where the cross-sectional area is made wide) between the chip capacitor 31 and the surface of the board. As a result, the resin 44 injected into the gap is completely filled in the gap without generating voids (air bubbles). This contributes to an improvement in the insulation reliability.

Note that, in the first embodiment, there is described the case where the same metal material (Cu) is used as a constituent material of the support base member 51 and the sacrificial conductor layer 53, which are etched at the final stage of the process. It is a matter of course, however, that the support base member 51 and the sacrificial conductor layer 53 are not necessarily formed of the same material. In brief, it is sufficient as long as the material allows the support base member or the sacrificial conductor member to be "selectively" etched from the other exposed constituent members when the support base member or the sacrificial conductor member is removed. In this case, the support base member and the sacrificial conductor member are each formed of a different material, and thus the etching step is performed in two stages.

Moreover, in each of the above embodiments, the case where the chip capacitors 31 are mounted as the passive elements on a corresponding one of the wiring boards 10 (30) and 10a (30a) is described as an example. It is a matter of course, however, that the passive elements to be mounted are not limited to chip capacitors. The present invention can be also applied to a wiring board on which passive elements (small electronic components) such as similar chip-shaped resistance elements are mounted.

In addition, in each of the above embodiments, the case where the wiring board 10 (30) or 10a (30a) is a coreless substrate is described as an example. It is a matter of course, however, that the wiring board 10 (30) or 10a (30a) is not limited to a coreless substrate. The present invention can be also applied to a wiring board having a core substrate fabricated by a general build up process, so long as the wiring board has pads exposed from the outermost insulating layer on the chip mounting surface side, and the surface of the insulating layer (i.e., the surface where underfill resin or molding resin flows) is flat.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
a structure in which a plurality of wiring layers are stacked with insulating layers interposed therebetween;
a plurality of pads for mounting an electronic component, the pads buried in an outermost insulating layer which constitutes a surface of the wiring board, on one surface side of the structure and the pads whose surface is exposed to a surface of the outermost insulating layer, the pads having a side face and a back face that contact the outermost insulating layer; and
a recessed portion formed in the outermost insulating layer at a place corresponding to a mounting area for the electronic component, and the recessed portion having a side face and a bottom face,
wherein when viewing with a cross section view, the recessed portion is formed as a rectangular-like shape, and the side face of the recessed portion is a straight face that extends in a vertical direction, and the bottom face of the rectangular-like shape is a curved face protruding to an inner side of the wiring board, and a corner portion of the bottom face and a corner portion of the side face are rounded; and
when viewing with a plan view, a part of the recessed portion is exposed from the electronic component which is to be mounted in the mounting area.

2. The wiring board according to claim 1, wherein the recessed portion is formed in the outermost insulating layer at an area between the pads to which electrode terminals of the electronic component to be mounted are to be connected, respectively.

3. The wiring board according to claim 2, wherein a chip capacitor is mounted as the electronic component.

4. The wiring board according to claim 3, wherein a mounting area for a semiconductor element is defined at a center portion on the outermost insulating layer, and the chip capacitor is mounted around the mounting area for the semiconductor element.

5. A semiconductor device comprising:
a wiring board including:
a structure in which a plurality of wiring layers are stacked with insulating layers interposed therebetween;
a plurality of pads for mounting an electronic component, the pads buried in an outermost insulating layer, which constitutes a surface of the wiring board, on one surface side of the structure and the pads whose surface is exposed to a surface of the outermost insulating layer, the pads having a side face and a back face that contact the outermost insulating layer; and
a recessed portion formed in the outermost insulating layer at a place corresponding to a mounting area for the electronic component and the recessed portion having a side face and a bottom face;
wherein when viewing with a cross section view, the recessed portion is formed as a rectangular-like shape, and the side face of the recessed portion is a straight face that extends in a vertical direction and the bottom face of the rectangular-like shape is a curved face protruding to an inner side of the wiring board, and a corner portion of the bottom face and a corner portion of the side face are rounded;
a semiconductor element mounted on the outermost insulating layer;
an electronic component mounted on the pads, when viewing with a plan view, a part of the recessed portion is exposed from the electronic component; and
an encapsulation resin for encapsulating the electronic component and the semiconductor element, wherein the encapsulation resin is filled in the recessed portion.

6. The wiring board according to claim 1, wherein when viewing with a plan view, the recessed portion is formed as a rectangular shape, and corner parts of the rectangular shape are rounded.

* * * * *